United States Patent [19]

Kosugi et al.

[11] Patent Number: 5,262,822
[45] Date of Patent: Nov. 16, 1993

[54] EXPOSURE METHOD AND APPARATUS

[75] Inventors: Masao Kosugi, Kanagawa; Akiyoshi Suzuki, Tokyo, both of Japan

[73] Assignee: Canon Kabushiki Kaisha, Tokyo, Japan

[21] Appl. No.: 956,474

[22] Filed: Oct. 2, 1992

Related U.S. Application Data

[60] Division of Ser. No. 874,205, Apr. 27, 1992, abandoned, which is a continuation of Ser. No. 758,304, Aug. 28, 1991, abandoned, which is a continuation of Ser. No. 289,535, Dec. 27, 1988, abandoned, which is a continuation of Ser. No. 212,147, Jun. 24, 1988, abandoned, which is a continuation of Ser. No. 145,716, Jan. 15, 1988, abandoned, which is a continuation of Ser. No. 80,204, Jul. 29, 1987, abandoned, which is a continuation of Ser. No. 795,418, Nov. 6, 1985, abandoned.

[30] Foreign Application Priority Data

Nov. 9, 1984 [JP] Japan .................. 59-236321

[51] Int. Cl.$^5$ .................. G03B 27/42
[52] U.S. Cl. .................. 355/53; 355/77
[58] Field of Search .................. 355/53, 77, 45

[56] References Cited

U.S. PATENT DOCUMENTS

| | | | |
|---|---|---|---|
| 4,172,656 | 10/1979 | Lacombat et al. | 355/53 |
| 4,402,586 | 9/1986 | Kanatani | 355/53 |
| 4,414,749 | 11/1983 | Johannsmeier | 33/180 |
| 4,422,755 | 12/1983 | Phillips | 355/45 |
| 4,473,293 | 9/1984 | Phillips | 355/53 |
| 4,540,277 | 9/1985 | Mayer et al. | 355/53 |
| 4,614,432 | 9/1986 | Kuniyoshi et al. | 356/401 |
| 4,640,619 | 2/1987 | Edmark, III | 356/372 |

FOREIGN PATENT DOCUMENTS

| | | |
|---|---|---|
| 1162776 | 2/1984 | Canada. |
| 55-135831 | 10/1980 | Japan. |
| 58-145127 | 8/1983 | Japan. |
| 59-79527 | 5/1984 | Japan. |
| 2112933 | 12/1982 | United Kingdom. |

OTHER PUBLICATIONS

SPIE vol. 53 Optical Microlithography IV (1985), pp. 90–101 K. W. Edmark, et al. "Stepper Overlay Calibration Using Alignment to a Latent Image."

*Primary Examiner*—Monroe H. Hayes
*Attorney, Agent, or Firm*—Fitzpatrick, Cella, Harper & Scinto

[57] ABSTRACT

An exposure method and apparatus for aligning a pattern of a mask with a pattern of a wafer is disclosed. and for transferring the pattern of the mask onto a resist layer formed on the surface of the wafer, wherein a portion of the resist layer on the wafer in the vicinity of an alignment mark formed on the wafer is exposed to light passed through a portion of the mask including an alignment mark formed on the mask, thereby to form a latent image of the alignment mark of the mask on the resist layer of the wafer, the latent image of the alignment mark of the mask formed on the resist layer of the wafer. The alignment mark formed on the wafer is detected so as to detect any positional deviation between the latent image and the alignment mark formed on the wafer. At least one of the mask and the wafer is displaced on the basis of the result of detection, and finally the resist layer of the wafer is exposed to light passed through a portion of the mask including the pattern.

45 Claims, 6 Drawing Sheets

EXPOSURE METHOD AND APPARATUS

This application is a continuation of prior application, Ser. No. 07/874,205 filed Apr. 27, 1992, which application is a continuation of prior application, Ser. No. 07/758,304 filed Aug. 28, 1991, which application is a continuation of prior application, Ser. No. 07/289,535 filed Dec. 27, 1988, which application is a continuation of prior application, Ser. No. 07/212,147 filed Jun. 24, 1988, which application is a continuation of prior application, Ser. No. 07/145,716 filed Jan. 15, 1988, which application is a continuation of prior application, Ser. No. 07/080,204 filed Jul. 29, 1987, which application is a continuation of prior application, Ser. No. 06/795,418 filed Nov. 6, 1985, all now abandoned.

FIELD OF THE INVENTION AND RELATED ART

This invention relates to exposure method and apparatus for use in the manufacture of semiconductor devices such as integrated circuits, large scale integrated circuits, etc. More particularly, the invention is concerned with a unique process and a unique system in relation to alignment and exposure in the manufacture of semiconductor devices.

Resolution and alignment accuracy are basic performances required in alignment and exposure apparatuses used in the field of manufacture of semiconductor devices. Also, throughput (processing ability) will be an essential performance in the point that the alignment and exposure apparatuses are productive machines. The tendency to further miniaturization and higher capacity of semiconductor devices has enforced further improvements in the resolution and alignment accuracy. Depending on an exposure process adopted, the alignment and exposure apparatuses are classified into a contact exposure type, a proximity exposure type, a 1:1 mirror projection exposure type, a lens projection exposure type, etc. Reduction lens projection type exposure apparatuses (called "steppers") have become dominant because of their capabilities of transferring more fine circuit patterns. Since advantages in the reduction lens projection type exposure systems in respect to the resolution have already been fully discussed in various printed publications, description thereof will be omitted here. However, examination made by Applicants of such lens projection type exposure systems has revealed that there still remain serious problems in respect to the alignment accuracy. That is, many lens projection type exposure systems employ such an alignment system which uses a light beam having a wavelength other than that of a light beam used for the exposure of a semiconductor wafer. To the contrary, the projection lens is usually designed such that the imaging performances and correction of aberration are assured only with respect to one particular wavelength which is, usually, that of the exposure light.

In view of the above, various measures have been proposed and taken to overcome the problems caused by using different wavelengths. However, it has been found that these measures themselves cause additional errors in relation to the alignment accuracy.

These errors are:

(A) An error due to the intervention of an intermediate reference or references, with respect to which alignment marks of a mask and a wafer are aligned to indirectly bring them into alignment with each other;

(B) An error due to an insufficient accuracy in the displacement of the wafer and/or the mask during a time period from the alignment to the exposure;

(C) An error with respect to the displacement caused by any change in temperature of the components, vibration or the like during the time period from the alignment to the exposure;

(D) An error due to any difference in the optical path length with respect to the light beams used for the alignment and the exposure, respectively; etc.

While it is possible to suppress these errors to some degree, it is not easy to stably maintain these errors at minimum levels.

U.S. Pat. No. 4,521,082, corresponding to Japanese Laid-Open Patent Application, Laid-Open No. 25638/1983, assigned to the same assignee of the subject application discloses an improved alignment and exposure system in which a light source for the alignment comprises an He-Cd laser providing a wavelength of 442 nm which is very close to the wavelength of exposure light (e.g. the g-line having a wavelength of 436 nm), and in which a projection lens is designed so that the aberrations are corrected with respect to these two wavelengths. With such arrangement, the above-described errors (A)-(D) can be obviated.

However, there still remains a problem such as follows:

As is known in the art, it is desired to suppress a standing-wave effect which occurs in the photoresist material applied to the wafer, in order to effectively utilize the resolving power of the projection lens. For this purpose, it has been proposed to subject the wafer surface to an anti-reflection treatment or to add a light-absorbing agent to the resist material. As a further alternative, it has been proposed to use a multi-layer structure for the resist layer. Such techniques will become more and more important in view of recent trends of further miniaturization and higher capacities of the semiconductor devices. If these processes are adopted, it may not so easy to obtain signals from the wafer during the alignment operation using a wavelength equal to or close to that used for the exposure.

SUMMARY OF THE INVENTION

It is accordingly a primary object of the present invention to provide a unique and improved exposure method and apparatus which is effective to suppress various errors peculiar to conventional alignment systems such as described in the foregoing and which can meet with the use of a light-absorptive resist material or a multi-layer resist layer.

As will be understood from the following description, the concept of the present invention is applicable not only to ordinary lens projection type exposure systems but also to lens projection type exposure systems and mirror projection type exposure systems using shorter wavelengths, as well as X-ray exposure apparatuses.

Briefly, according to the present invention, there is provided an exposure method and apparatus for aligning a pattern of a mask with a pattern of a wafer and for transferring the pattern of the mask onto a resist layer formed on the surface of the wafer, wherein a small portion of the resist layer on the wafer in the vicinity of an alignment mark formed on the wafer is exposed to light passed through a small portion of the mask including an alignment mark formed on the mask, thereby to form an image of the alignment mark of the mask on the resist layer of the wafer, the image of the alignment mark of the mask formed on the resist layer of the wafer and the alignment mark formed on the wafer being detected so as to detect any positional deviation between the image and the alignment mark formed on the wafer, at least one of the mask and the wafer being displaced on the basis of the result of detection, and finally the resist layer of the wafer being exposed to light passed through a portion of the mask including the pattern.

In summary, according to the present invention, any local change in the resist layer resulting from the exposure is detected as a signal related to the mask.

More specifically, when the resist material is irradiated with light, there occurs an opto-chemical reaction in the resist material. Also, in respect to an optical phenomenon, the irradiation causes changes in the transmission factor and in the refractive index of the resist material. Depending on the kind of the resist material used, it also causes expansion or contraction of the resist material which results in formation of a stepped portion at the boundary between the irradiated area and the non-irradiated area. For an ordinarily used OFPR resist or AZ resist material, for example, the result of such selective exposure or irradiation can be observed through a microscope and under a white light, as an image defined by the difference in brightness when viewed. More particularly, when the resist material is selectively or partially exposed to light, the transmission factor of the exposed portion of the resist material increases as the result of exposure. Therefore, the exposed area of the resist material can be observed as a bright area as compared with the non-exposed area, even if the resist material is not yet subjected to a "developing" process. Thus, an image is observable on the resist material after the selective exposure and before the development. Hereinafter, such image formed only by the exposure will be referred to as a "latent image".

The present invention uses such "latent image" for the sake of the alignment between the reticle and the wafer.

That is, when any latent image of a reticle is just formed on a resist layer of a wafer by means of an exposure optical system, the thus formed latent image does not contain any error in relation to the reticle. In other words, the latent image formed by the exposure optical system bears exact positional information with respect to the reticle by way of the exposure optical system. It follows therefrom that, if any positional deviation between the latent image formed on the resist layer and a reference preparatively formed on the substrate of the wafer is detected, the positional relation between the reticle and the wafer by way of the exposure optical system can be very exactly detected. According to the present invention, in view of the above, a latent image of an alignment mark of a reticle is formed on a resist layer of a wafer, preferably at a position in close vicinity of an alignment mark preparatively formed on the substrate of the wafer, and the positional deviation between the latent image thus formed on the resist layer and the alignment mark of the wafer is detected to thereby detect the positional relation between the reticle and the wafer. This assures extraordinarily accurate and stable detection of the positional relation between the reticle and the wafer, without being affected by the exposure optical system, since the detection of the positional deviation between the latent image and the alignment mark of the wafer is exactly equivalent to detection of the positional relation between two juxtaposed images formed on the same object.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
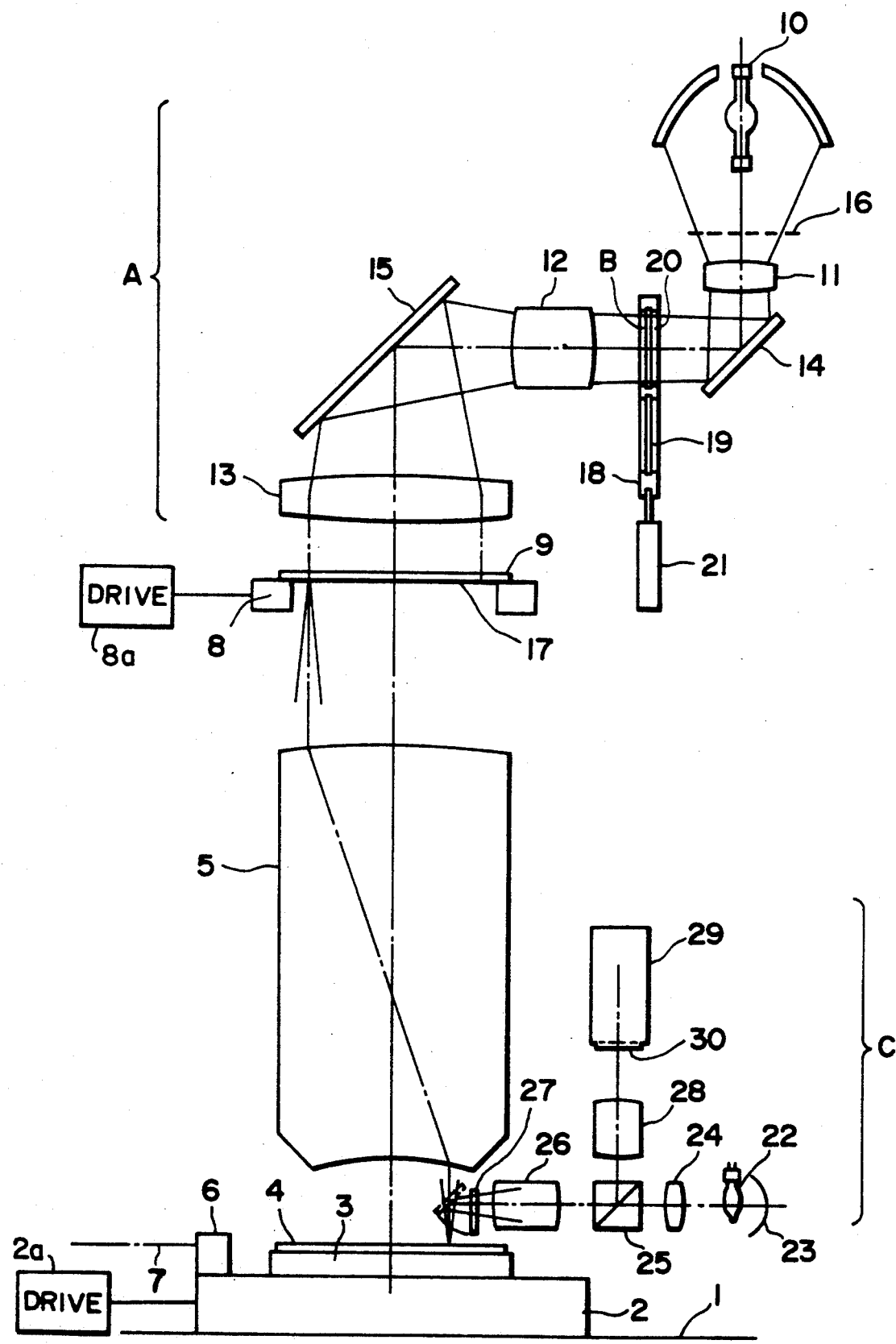
FIG. 1 is a schematic and diagrammatic view of an alignment and exposure apparatus to which an embodiment of the present invention is applied.

Referring first to FIG. 1, there is shown an alignment and exposure apparatus according to one embodiment of the present invention.

As shown in FIG. 1, the main assembly of the exposure apparatus is carried by a surface plate 1. Disposed on the surface plate 1 is a wafer stage 2 which supports a wafer holder 3 and a wafer 4 held on the holder 3 by vacuum suction or the like. The stage 2 supports the holder 3 and the wafer 4 for movement in a plane perpendicular to an optical axis of the projection lens 5, by means of a drive unit 2a of known type. The wafer stage 2 has formed thereon a mirror 6 on which a beam 7 from an unshown laser interferometer is incident, whereby the position of the wafer stage 2 can be detected in a known manner and whereby the movement of the wafer stage 2 can be controlled also in a known manner. Located above the projection lens 5 is a reticle 9 held by a reticle holder 8. The holder 8 is movable in a plane perpendicular to the optical axis of the projection lens 5 by means of a drive unit 8a of known type. Disposed above the reticle 9 is an illumination optical system generally denoted at reference A. When a light beam is supplied to the reticle 9 from the illumination optical system A, a pattern formed on the reticle 9 is transferred by means of the projection lens 5 onto the surface of the wafer 4.

The illumination optical system A comprises a light source 10 such as a super Hg lamp, first to third condenser lenses 11-13 provided to uniformly illuminate the surface of the reticle 9 with a light supplied by the light source 10, first and second mirrors 14 and 15 provided to bend or deflect the light beam, and a shutter 16 for controlling the exposure.

Figure 5:
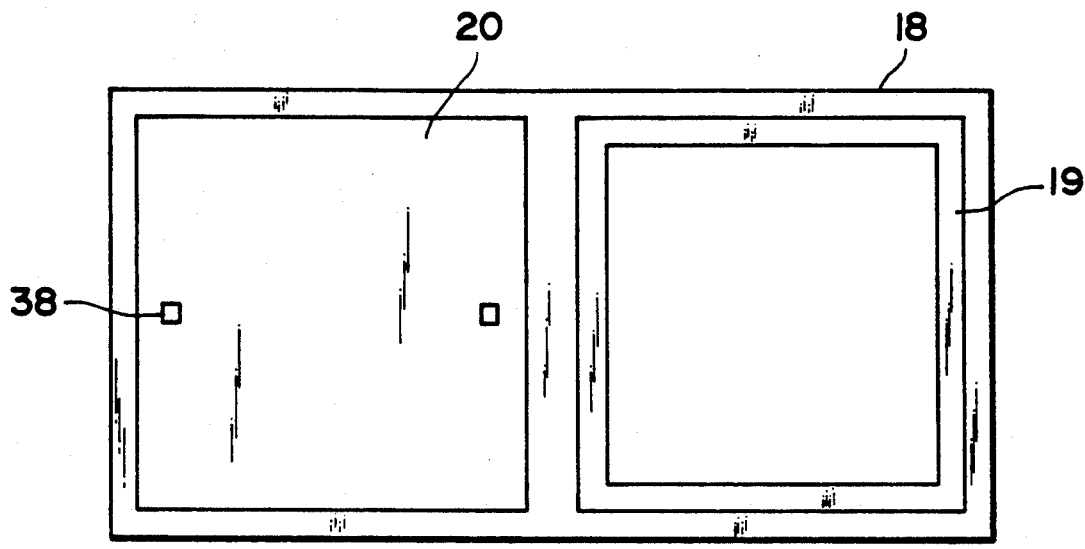
FIG. 5 is a plan view of a masking member used in an embodiment of the present invention, for the sake of selective exposure.

The second and third condenser lenses 12 and 13 and the second mirror 15 are arranged to co-operate with each other so as to bring a plane B into an optically conjugate relation with a pattern bearing surface 17 of reticle 9. Accordingly, by disposing an appropriate masking member on the plane B, only a desired area of the reticle 9 can be illuminated. Actually, a masking member 18 is disposed on the plane B. As is best seen in FIG. 5, the masking member 18 includes two masks 19 and 20 which are held by a common frame member. The mask 19 is provided for the sake of selective exposure of only a circuit pattern area of the reticle 9, while the mask 20 is provided for the sake of selective exposure of only alignment mark areas of the reticle 9, as will be described later. An actuator 21 (FIG. 1) such as a combination of a cylinder and a plunger is coupled to the masking member 18 to move the masking member 18 along the plane B, so that the masks 19 and 20 are interchangeably disposed in the path of the flux of light reflected from the first mirror 14.

The alignment and exposure apparatus further includes an alignment optical system generally denoted at reference C in FIG. 1. As shown in this Figure, the alignment optical system C is disposed in such manner that a portion thereof is inserted into a space between the projection lens 5 and the wafer 4. The alignment optical system C includes a light source 22 such as a halogen lamp. The light beam emitted from the light source 22 is condensed by a condensing mirror 23 and a condenser lens 24 and, after passing through a half prism 25 and an objective lens 26, is incident on a movable mirror 27. The mirror 27 is movable between a solid line position and a broken line position. At the broken line position, the mirror 27 is inclined at an angle of 45 degrees with respect to the optical axis of the projection lens 5. At this position, the mirror 27 is effective to reflect the light beam incident thereon toward the wafer 4 surface to illuminate it. The light beam incident on the wafer 4 surface is reflected thereby and the reflected light beam is directed to the half prism 25 by way of the movable mirror 27 and the objective lens 26. The light beam incident on the half prism 25 is reflected upwardly by the prism 25, so the light beam after passing through a relay lens 28 is focused on a surface 30 of an image pickup tube 29. By this, an image of a portion of the wafer 4 is formed on the image pickup surface 30.

Preferably, the light source 22 produces a light beam to which a photoresist material applied to the wafer 4 surface is not sensitive. If a light beam produced by any light source used contains such component to which the photoresist material used is sensitive, a filter may be used to intercept the sensitizing component.

While only one portion of the alignment optical system C is illustrated in FIG. 1, the alignment and exposure apparatus of this embodiment actually includes two sets of alignment optical systems so as to detect the positional relation between the reticle 9 and the wafer 4 at two points. The two-point detection is preferable because it allows ready and accurate alignment between the reticle 9 and the wafer 4 in X, Y and $\theta$ axes which are three orthogonal directions, only by displacement of at least one of the reticle 9 and the wafer 4 in a plane perpendicular to the optical axis of the projection lens 5.

Figure 3A:
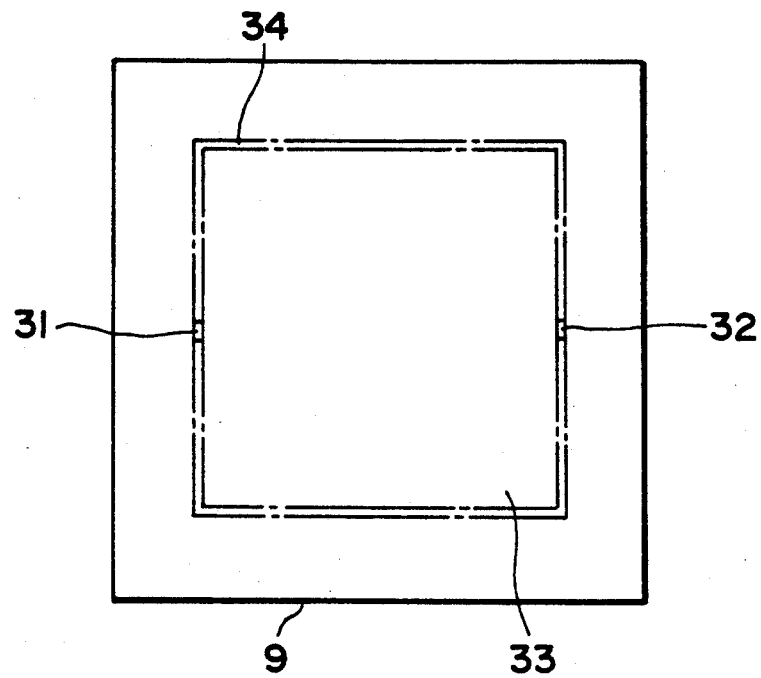
FIG. 3A is a plan view of a reticle used in an embodiment of the present invention.
Figure 3B:
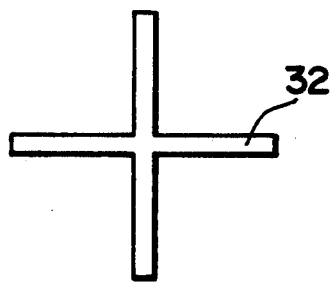
FIG. 3B is an enlarged plan view showing one of the alignment marks formed on the reticle of FIG. 3A.

Referring now to FIG. 3A and 3B, description will be made to alignment marks formed on the reticle 9, used in this embodiment of the present invention.

FIG. 3A is a plan view of the reticle 9. As shown in this Figure, the reticle 9 has two alignment marks 31 and 32, a circuit pattern area 33 in which a circuit pattern to be transferred onto the wafer 4 is formed, and a region 34 which corresponds to scribe lines on the wafer 4 (see FIG. 4A). The alignment marks 31 and 32 are formed in the region 34. FIG. 3B is an enlarged view showing one (32) of the alignment marks of the reticle 9. The other alignment mark 31 is of the same configuration as the alignment mark 32. In FIG. 3B, the alignment mark 32 has a cross-shape, and the cross-shaped area defined within the outer configuration of the mark 32 provides a light-transmitting area. Thus, when a light beam is incident on a portion of the reticle 9 containing the alignment mark 32 or 31, a portion of such light beam is allowed to pass through the reticle 9.

While, in this embodiment, each of the alignment marks 31 and 32 is formed by a cross-shaped light-transmitting area as illustrated, this is not limitative and it may be provided by a cross-shaped light-intercepting area, as will be understood from the following part of the Specification.

Figure 4A:
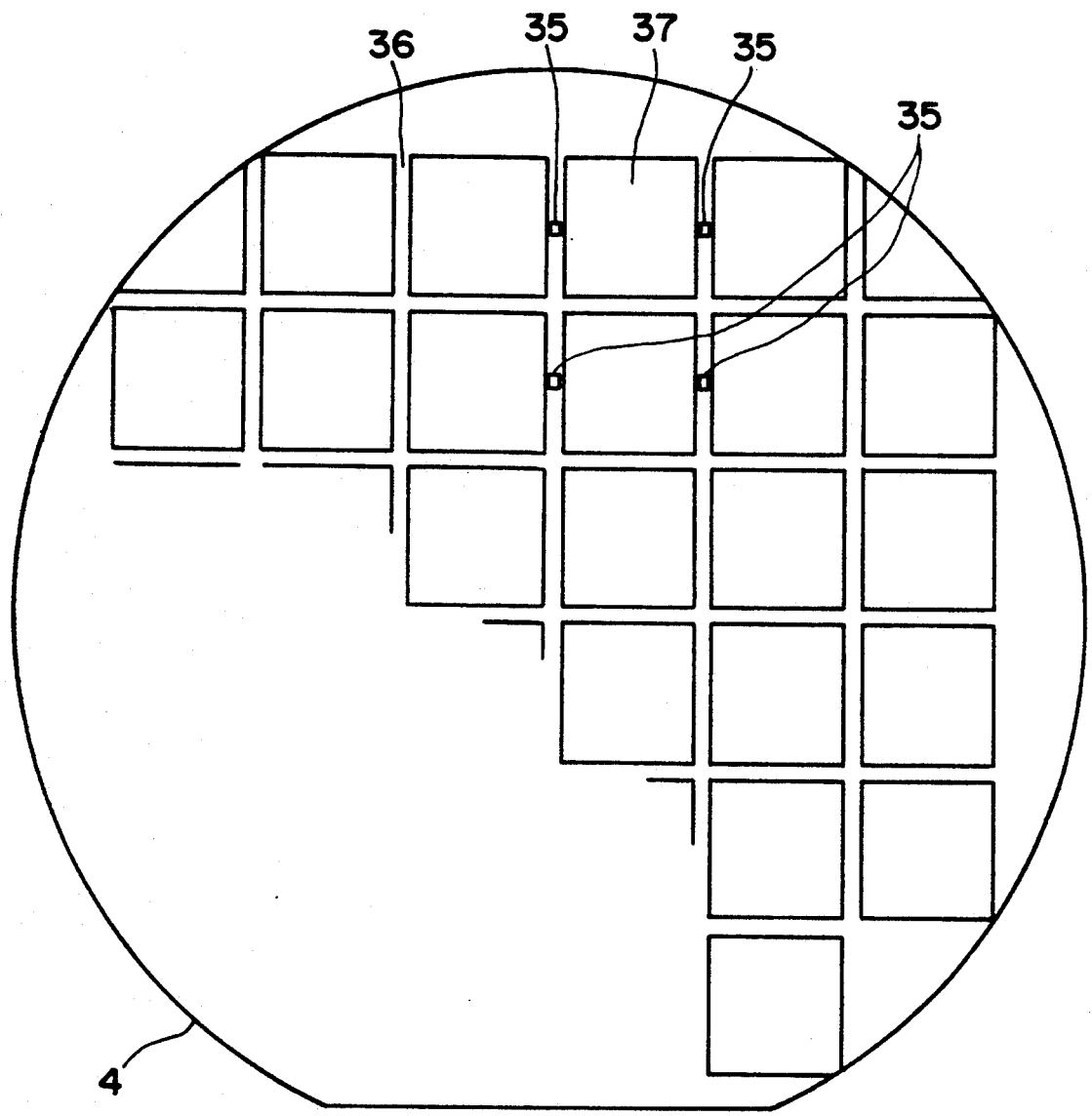
FIG. 4A is a plan view of a wafer used in an embodiment of the present invention.
Figure 4B:
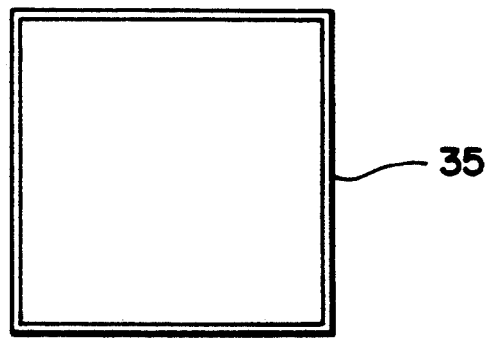
FIG. 4B is an enlarged plan view showing one of alignment marks formed on the wafer of FIG. 4A.

Referring to FIGS. 4A and 4B, description will now be made to alignment marks of the wafer 4. FIG. 4 is a plan view of the wafer 4. As shown in this Figure, a number of shot areas (chips) 37 each corresponding to the circuit pattern area 33 of the reticle 9 (FIG. 3A) are formed on the wafer 4. Also, a plurality of alignment marks 35 are formed on the wafer 4. These alignment marks 35 are located in the scribe lines 36 defined between adjacent shot areas 37. FIG. 4B is an enlarged view showing one of the alignment marks 35 of the wafer 4. In FIG. 4B, the alignment mark 35 is generally of square shape, and the area defined between inner and outer solid-line boxes is formed by a continuous recess or groove, as is best seen in FIG. 6B. Each of the remaining alignment marks 35 of the wafer has the same configuration as of that illustrated in FIG. 4B.

FIG. 5 shows details of the masking member 18 adapted to be used with the reticle 9 of FIG. 3A, for the sake of selective exposure thereof. As described hereinbefore, the masking member 18 includes the mask 19 which is arranged for the sake of exposure of only the circuit pattern area 33 of the reticle 9 and the mask 20 which is arranged for the sake of selective exposure of only small portions of the reticle 9 including the alignment marks 31 and 32. As shown in FIG. 5, the mask 19 has a light-transmitting area of square shape, corresponding to the circuit pattern area 34 of the reticle 9, and a light-blocking area defined at the peripheral portion of the light-transmitting area. On the other area, the mask 20 has two small light-transmitting areas 38 (which hereinafter "windows") each having a square shape as illustrated. The remaining area of the mask 20 forms a light-blocking portion. The windows 38 are disposed so that, when the mask 20 is introduced into the optical path such as shown in FIG. 1, these windows 38 are imaged on small portions of the surface of the reticle 9 including the alignment marks 31 and 32, respectively. Also, the shape and size of each of the windows 38 are selected to assure that the light beam passed therethrough is incident on the portion of the reticle 9 surface fully including the whole of an associated one of the alignment marks 31 and 32 of the reticle 9. Each of the masks 19 and 20 may be formed by selectively coating a transparent glass substrate with a chromium material for the sake of selective interception of the light, as the reticle 9. Preferably, however, each light-transmitting area of the masks 19 and 20 is defined by a hole or vacancy in order to preclude undesirable adhesion of any foreign particles.

Figure 2B:
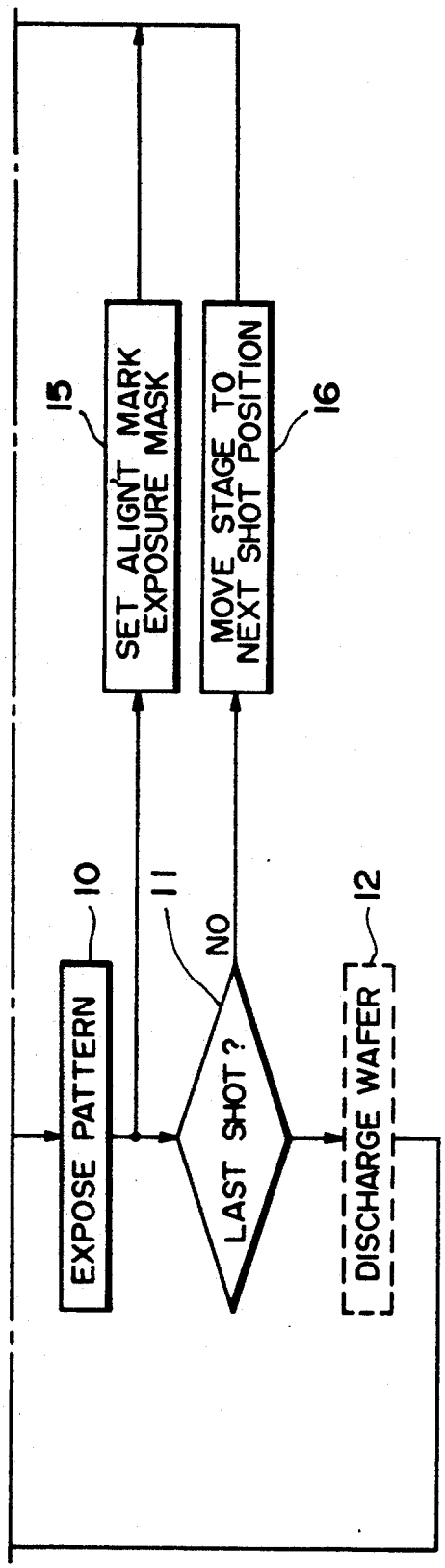
FIGS. 2A and 2B are assembled to form a flow chart showing an alignment and exposure operation according to one embodiment of the present invention.
Figure 2:
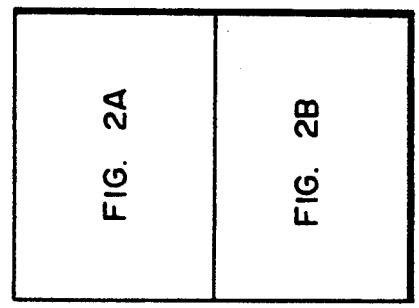
FIG. 2 shows how
Figure 2A:
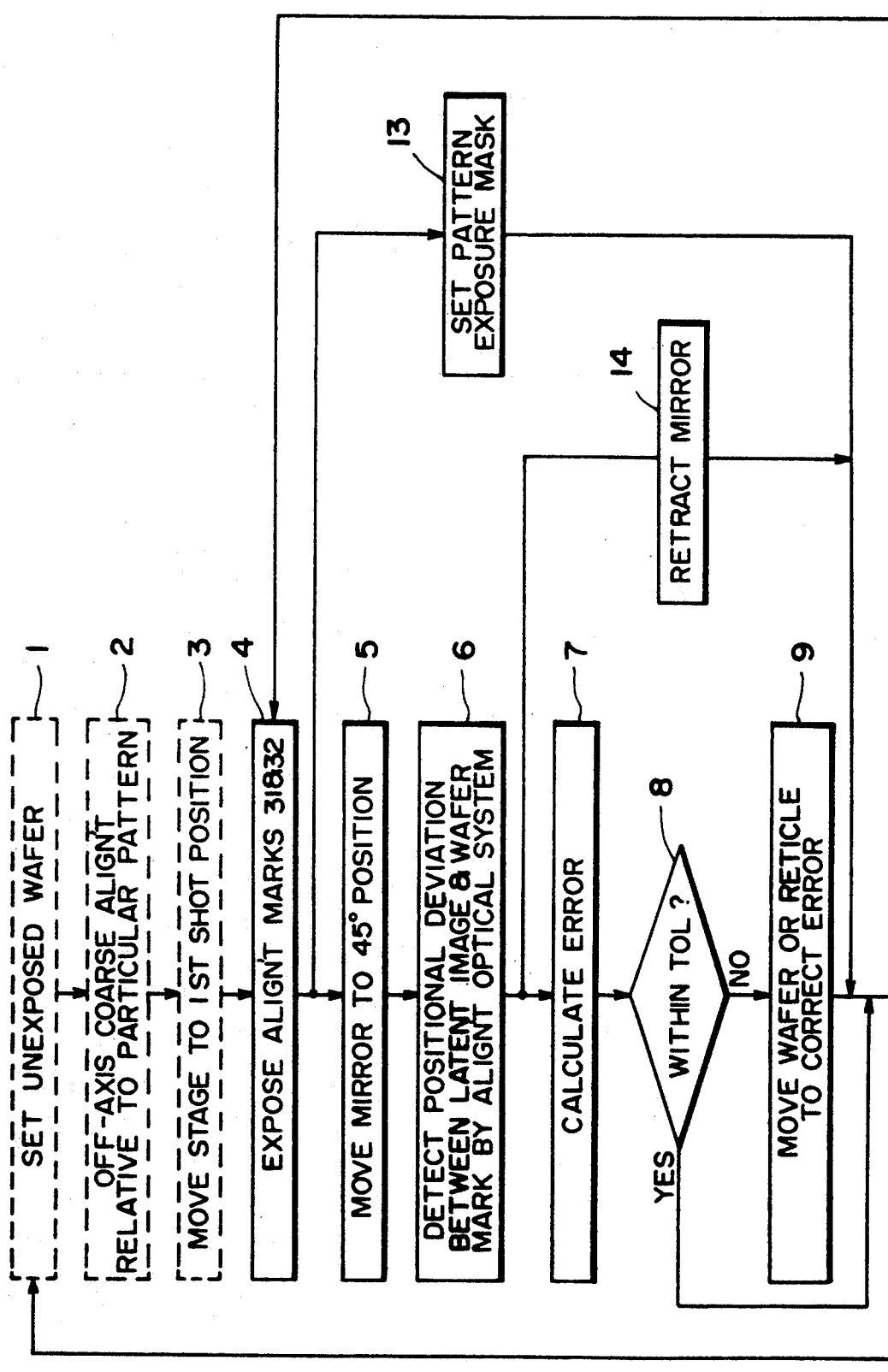

FIGS. 2A and 2B together are a flow chart showing an example of the alignment and exposure operation of the apparatus of FIG. 1. Briefly, in the flow chart of FIGS. 2A and 2B, the blocks defined by solid lines depict steps peculiar to the present invention, while the blocks defined by broken lines denote steps similar to corresponding steps of conventional alignment and exposure systems.

First, at Step 1, an unexposed wafer 4 (a wafer 4 having a resist coating which has not been exposed to light) is placed on the wafer stage 3. Subsequently, one or more particular patterns (which are coarse alignment marks or prealignment marks) formed on the wafer 4 are detected by one or both of the alignment optical systems C, to thereby achieve coarse alignment of the wafer 4 (Step 2). Then, at Step 3, the wafer stage 3 is moved so that a first shot area of the wafer 4 is positioned under the projection lens 5. Subsequently, the shutter 16 is actuated to allow passage of the light beam to the reticle 9. At this time, the mask 20 for the selective exposure of the alignment marks of the reticle 9 has already been initially set at the position shown in FIG. 1. Therefore, only small portions of the reticle 9 containing the alignment marks 31 and 32 (FIG. 3A) are irradiated with the light beams passed through the windows 38 of the mask 20 shown in FIG. 5 (Step 4). Since each of the alignment marks 31 and 32 of the reticle 9 is formed by a light-transmitting area of cross-shape, as described in the foregoing, portions of the wafer 4 surface are exposed to the light beams passed through the alignment marks 31 and 32 of the reticle 9. By this, latent images of the alignment marks 31 and 32 are formed on or in the resist layer of the wafer 4.

Subsequently, the mirror 27 of each of the alignment optical systems C is moved to its 45-degree position (broken line position), which is under the projection lens 5, so as to allow observation of corresponding one of the latent images as well as corresponding one of the alignment marks formed on the wafer 4 (Step 5). Then, at Step 6 any positional deviation between each of the alignment marks 35 of the wafer 4 and corresponding one of the latent images, formed on the wafer 4, of the alignment marks 31 and 32 of the reticle 9 is detected by a corresponding one of the alignment optical systems C. Thereafter, the positional error between the reticle 9 and the wafer 4 is calculated (Step 7), and whether or not the thus detected error within a tolerance is discriminated at Step 8. If not within the tolerance, then at least one of the wafer 4 and the reticle 9 is moved by an amount corresponding to the error to thereby correct the same (Step 9). Then, the sequence proceeds to Step 10. If the result of discrimination at Step 8 shows that the tolerance is satisfied, then the sequence directly proceeds to Step 10. Step 10 is a step for effecting exposure of the circuit pattern. Prior to initiation of Step 10, the alignment mark exposure mask 20 has been replaced by the circuit pattern exposure mask 19 (Step 13) and the mirrors 27 have been retracted out of the path of exposure light (Step 14). By this, only the circuit pattern area of the reticle 9 is exposed to light from the light source 10, as the result of which, only the circuit pattern of the reticle 9 is transferred onto the wafer 4. After completion of Step 10, the circuit pattern exposure mask 19 is replaced by the alignment mark exposure mask 20 (Step 15). Also, whether or not the just exposed shot area is the last shot area is discriminated at Step 11. If not the last shot area, then the wafer stage 3 is moved so as to place the next shot area at a position under the projection lens 5 (Step 16). When the exposure of the last shot area of the wafer 4 is completed (Step 11), the wafer 4 is discharged (Step 12), and the same process as described in the foregoing is effected relative to the next wafer.

Figure 6A:
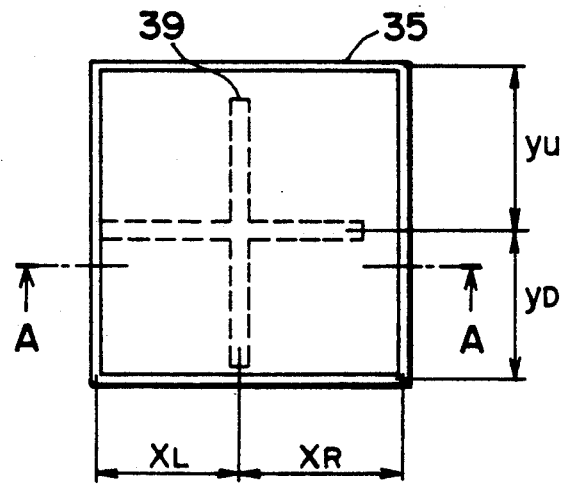
FIG. 6A is an enlarged plan view showing the relation between the alignment mark of the wafer and the latent image of the alignment mark of the reticle formed on the wafer.
Figure 6B:
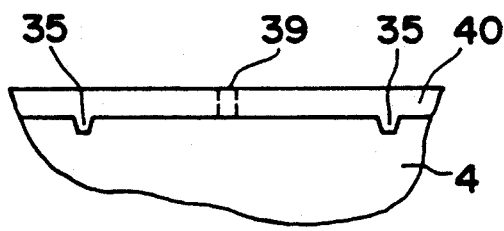
FIG. 6B is a cross-section taken on line A—A in FIG. 6A.
Figure 6C:
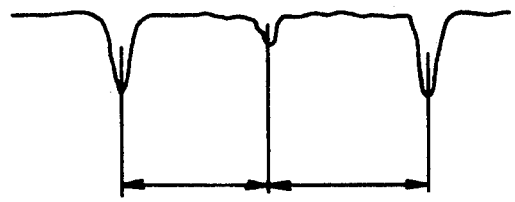
FIG. 6C shows a waveform of a signal obtained by scan along line A—A in FIG. 6A.

Referring now to FIGS. 6A-6C, description will be made to the manner of detection of the positional relation between the reticle 9 and the wafer 4 by way of the projection lens 5.

In FIG. 6A, there is shown one of the alignment marks 35 formed on the wafer 4. Also shown in this FIG. by broken lines is a latent image 39 which corresponds to one of the alignment marks 31 and 32 of the reticle 9 and which is formed on the resist layer of the wafer 4 by the selective exposure of the reticle 9 by means of the mask 20 shown in FIG. 5. In this embodiment, the area of the latent image 39 enclosed by the broken line is the exposed area which has been exposed to the light passed through the alignment mark 31 or 32 of the reticle 9. FIG. 6B is a sectional view taken on line A—A shown in FIG. 6A.

In the state illustrated in FIGS. 6A and 6B, the reticle mark latent image 39 is slightly deviated with respect to the wafer alignment mark 35. When the wafer alignment mark 35 and the reticle mark latent image 39 are observed by the alignment optical system C and when an image of a portion of the wafer 4 surface containing the alignment mark 35 and the latent image 39 is formed on the image pickup surface of the image pickup tube 29, scanning along one scan line of the image pickup tube (e.g. the scan line corresponding to the line A—A in FIG. 6A) will produce an electric signal such as shown in FIG. 6C.

The positional deviation between the wafer alignment mark 35 and the reticle mark latent image 39 with respect to each of the X direction and the Y direction is obtainable from two-dimensional information supplied by the entire field of the image pickup tube. Since the manner of detection of such positional deviation is well known in the art, description thereof will be omitted here only for the sake of simplicity of explanation.

At the time at which the alignment marks 31 and 32 of the reticle 9 are imaged on the resist layer 40 (FIG. 6B) of the wafer 4, the positional deviation between one of the two wafer alignment marks 35 and the latent image 39 of corresponding one of the reticle alignment marks 31 and 32, with respect to the X and Y directions, can be calculated according to the following equations:

$$\Delta X = (x_L - x_R)/2$$

$$\Delta Y = (y_U - y_D)/2$$

Since, in this embodiment, the positional relation between the reticle 9 and the wafer 4 is detected at two points with the use of two reticle alignment marks and two wafer alignment marks, four values $\Delta X_R$, $\Delta Y_R$, $\Delta X_L$ and $\Delta Y_L$ are obtainable. From these four values, whether or not the positional error between the reticle 9 and the wafer 4 is within a tolerance is discriminated. If not within the tolerance, then the wafer stage is moved in accordance with the following equations:

$$\delta x = (\Delta X_L + \Delta X_R)/2$$

$$\delta y = (\Delta Y_R + \Delta Y_L)/2$$

$$\delta\theta = (\Delta Y_R - \Delta Y_L)/2$$

Of course, the reticle may be moved in place of or together with the wafer. During these operations, the movable mirrors 27 are retracted out of the path of the exposure light and the pattern exposure mask 19 is introduced in place of the alignment mark exposure mask 20. By doing so, the exposure and transfer of the circuit pattern can be effected immediately after completion of the stage movement.

While in the foregoing embodiment, the invention has been described with reference to an alignment and exposure apparatus of lens projection type, the concept of the present invention is applicable also to other types of exposure systems. For example, the present invention is effectively applicable to an X-ray exposure apparatus of proximity type since a latent image, formed in such case, is also a "result of exposure".

Moreover, the concept of the latent image alignment of the present invention is effectively applicable to an off-axis microscope. That is, among various factors of errors in the off-axis alignment systems, the distance between the optical axis of the projection lens and the optical axis of the off-axis microscope (i.e. the reference length) is the most important one. The accuracies of the off-axis alignment system vitally depend on whether or not the reference length is stably maintained constant or, alternatively, if the reference length is changed, whether or not an exact value of the changed reference length is detected. While several proposals have been made as to measurement or detection of the reference length, additional intermediate measuring means has to be used according to these proposals. The intervention of such intermediate measuring means leads to a higher possibility of picking up any error during measurement.

In the present invention, as compared therewith, the positional relation between the alignment mark of the reticle to be imaged on the wafer, more particularly the image of the reticle alignment mark as projected onto the wafer, and the optical axis of the off-axis alignment system (such as the alignment system C shown in FIG. 1) exactly corresponds to the reference length. In other words, such positional relation itself is substantially the reference length. Accordingly, the alignment mark such as shown in FIG. 3B is imaged on a portion of the wafer surface other than the shot areas and the wafer stage is moved so that a latent image corresponding to the alignment mark is detected by the off axis alignment microscope. Then, the reference length can be calculated on the basis of the result of detection of the position of the latent image and on the basis of the amount of movement of the wafer stage. This allows direct and extraordinarily accurate measurement of the reference length.

Also, according to such principle of measurement, the correctness of the reference length can be confirmed at any time during the routine of treatment of the wafers without any specific instrument or complicated handling.

While the invention has been described with reference to the structure disclosed herein, it is not confined to the details set forth and this application is intended to cover such modifications or changes as many come within the purposes of the improvements or the scope of the following claims.

What is claimed is:

1. An exposure method for aligning a reticle having a circuit pattern with a wafer and for transferring the pattern of the reticle onto a resist layer formed on the surface of the wafer, said method comprising the steps of:

exposing a portion of the resist layer on the wafer in the vicinity of an alignment mark formed on the wafer to a light passed through a portion of the reticle including an alignment mark formed on the reticle, thereby to form a latent image of the alignment mark of the reticle on the resist layer of the wafer;

detecting the latent image of the alignment mark of the reticle formed on the resist layer of the wafer and the alignment mark formed on the wafer to detect any positional deviation between the latent image and the alignment mark formed on the wafer;

displacing at least one of the reticle and the wafer on the basis of the detection; and exposing the resist layer of the wafer to a light passed through a portion of the reticle including the circuit pattern.

2. A method according to claim 1, wherein the latent image of the alignment mark of the reticle formed on the resist layer is detected photoelectrically with use of a light beam having a wavelength different from that of the light used for the exposure of the circuit pattern.

3. An alignment and exposure apparatus for aligning a reticle, having a circuit pattern and an alignment mark, with a wafer provided with a resist layer and having an alignment mark, and for transferring the circuit pattern of the reticle onto the resist layer provided on the wafer, said apparatus comprising:

an exposure optical system for selectively exposing different portions of the reticle to light, said exposure optical system being operable to form, by the selective exposure, a latent image of the alignment mark of the reticle onto the wafer;

means for detecting the alignment mark of the wafer and the latent image of the alignment mark of the reticle, formed on the wafer by the selective exposure, so as to detect positional deviation therebetween; and means for bringing the reticle and the wafer into a predetermined positional relation, in accordance with the detection by said detecting means.

4. An apparatus according to claim 3, wherein said detecting means includes a portion which is movable out of a path of the light from said exposure optical system, during the selectively exposure.

5. An exposure method for aligning a reticle, having a circuit pattern, with a wafer, having an alignment mark formed thereon, and for transferring the pattern of the reticle onto a resist layer formed on the surface of the wafer said method comprising the steps of:

exposing a first portion of the resist layer on the wafer to light passed through a first portion of the reticle that includes an alignment mark formed on the reticle, thereby to form a latent image of the alignment mark of the reticle on the resist layer of the wafer;

detecting the latent image of the alignment mark of the reticle formed on the resist layer of the wafer and the alignment mark formed on the wafer to detect any positional deviation between the latent image and the alignment mark on the wafer;

displacing at least one of the reticle and the wafer on the basis of the detection; and exposing the resist layer of the wafer to light passed through a second portion of the reticle including the circuit pattern.

6. An alignment and exposure apparatus for aligning a reticle, having a circuit pattern, and an alignment mark formed thereon, with a wafer provided with a resist layer and having an alignment mark formed thereon, and for transferring the circuit pattern of the reticle onto the resist layer provided on the wafer, said apparatus comprising:

an exposure optical system for exposing the reticle to light, said exposure optical system being operable to form, by the exposure, a latent image of the alignment mark of the reticle on the wafer;

means for detecting the alignment mark of the wafer and the latent image of the alignment mark of the reticle, formed on the wafer by the exposure, so as to detect positional deviation therebetween; and means for bringing the reticle and the wafer into a predetermined positional relation, in accordance with the detection by said detecting means.

7. An apparatus according to claim 6, wherein said exposure optical system includes a light source, an illumination optical system for directing light from said light source to the reticle, and a projection optical system for directing light from the reticle to the wafer to project images of the circuit pattern and the alignment mark of the reticle upon the wafer, and wherein said illumination optical system includes masking means disposed in an optically conjugate relation with the reticle to allow selective illumination of a desired portion of the reticle.

8. An apparatus according to claim 7, wherein said detecting means includes an observation optical system disposed in the neighborhood of said projection optical system to observe the alignment mark of the wafer and the latent image of the alignment mark of the reticle a formed on the wafer.

9. A method of detecting a positional relationship between an original having a first reference mark and a workpiece having a second reference mark, said method comprising the steps of:

exposing with radiation the workpiece, which has a radiation-sensitive layer, to a pattern of the first reference mark to form in the radiation-sensitive layer a latent image of the first reference mark; and observing the second reference mark and the latent image of the first reference mark, on the workpiece, to detect the positional relationship between the original and the workpiece.

10. A method according to claim 9, wherein the formation of the latent image of the first reference mark includes the steps of placing the workpiece on a movable stage, positioning the workpiece placed on the movable stage with respect to an exposure position, irradiating the first reference mark of the original with radiation, and projecting the pattern of the first reference mark upon the workpiece by use of a projection lens system.

11. A method according to claim 10, wherein the second reference mark and the latent image of the first reference mark, on the workpiece, are observed by photoelectric detection using a photoelectric detecting means making an electric signal, located in the neighborhood of the projection lens system, whereby the positional relationship between the original and the workpiece is detected on the basis of the electric signal produced as a result of the photoelectric detection.

12. A method for detecting a diversion in the registration of a substrate and a mask in an apparatus for aligning said substrate with said mask, said substrate having a first mark means and said mask having a second mark means formed thereon to have a predetermined positional relation with said first mark means when said substrate and said mask are brought into registration with each other, said method comprising the steps of:

forming a photosensitive layer on said substrate so that said first mark means is covered with said photosensitive layer;

projecting, after said registration, an exposure energy beam onto said substrate to be exposed through said mask to form on said photosensitive layer a latent image of said second mark means;

supplying a radiation beam onto said photosensitive layer;

photoelectrically detecting said latent image and said first mark means without development of said photosensitive layer; and detecting the positioning relation between said first mark means and said latent image to determine said diversion.

13. A method for detecting a diversion in the registration of a substrate and a mask in an apparatus for aligning said substrate with said mask, said substrate having a first mark means and said mask having a second mark means formed thereon to have a predetermined positional relation with said first mark means when said substrate and said mask are brought into registration with each other, said method comprising the step of:

forming a photosensitive layer on said substrate so that said first mark means is covered with said photosensitive layer;

projecting, after said registration, an exposure energy beam onto said substrate to be exposed through said mask to form on said photosensitive layer a latent image of said second mark means;

supplying a radiation beam onto said photosensitive layer;

photoelectrically detecting said latent image and said first mark means on a basis of the optical properties of said latent image and said first mark means; and detecting the positional relation between said first mark means and said latent image to determine said diversion.

14. A method for detecting a diversion in the registration of a substrate and a mask in an apparatus for aligning said substrate with said mask, said substrate having a first mark means and said mask having a second mark means formed thereon to have a predetermined positional relation with said first mark means when said substrate and said mask are brought into registration with each other, said method comprising the step of:

forming a photosensitive layer on said substrate so that said first mark means is covered with said photosensitive layer;

projecting, after said registration, an exposure energy beam onto said substrate to exposed through said mask to form on said photosensitive layer a latent image of said second mark means;

supplying a radiation beam onto said photosensitive layer;

photoelectrically detecting said latent image on the basis of a regular reflection of said radiation beam and said first mark means on a basis of a scattering of said radiation beam; and detecting the positional relation between said first mark means and said latent image to determine said diversion.

15. The method according to claim 13 or 14, wherein said second mark means is projected onto said substrate by a projection optical system provided between said mask and said substrate, and said radiation beam is supplied onto said photosensitive layer.

16. The method according to claim 15, further including forming a beam spot scanning along a scanning line on a surface functionally related to a surface of said substrate, and said positional relation is detected on the basis of a variation in optical properties on said surface and a scanning position of said beam spot.

17. The method according to claim 16, wherein said exposure energy beam has a first wavelength effective in sensitizing said photosensitive layer and said radiation beam has a second wavelength which does not sensitize said photosensitive layer.

18. The method according to claim 16, wherein said exposure energy beam and said radiation beam each have a wavelength effective in sensitizing said photosensitive layer, and the sensitizing wavelengths are filtered from said radiation beam.

19. The method according to claim 13 or 14, further comprising the step of correcting said registration on the basis of said detected positional relation.

20. The method according to claim 13 or 14, wherein said latent image of said second mark means is formed near said first mark means of said substrate.

21. A method for detecting a diversion in the registration of a substrate and a mask in an apparatus for aligning said substrate and said mask, said substrate having a first mark means and said mask having a second mark means formed thereon to have a predetermined positional relation with said first mark means when said substrate and said mask are brought into registration with each other, said method comprising the steps of:

forming a photosensitive layer on said substrate so that said first mark means is covered with said photosensitive layer;

projecting, after said registration, an exposure energy beam onto said substrate to be exposed through said mask to form on said photosensitive layer a latent image of said second mark means;

supplying a spot of a radiation beam scanning along a scanning line on a surface functionally related to a surface of said substrate; and detecting the positional relation between said first mark means and said latent image on the basis of optical information from said surface and a scanning position of said spot.

22. The method according to claim 21, further comprising the step of correcting said registration on the basis of said detected positional relation.

23. The method according to claim 21, further comprising the step of photoelectrically detecting a regular reflection from said surface of said substrate, wherein said positional relation is detected on the basis of a variation of said regular reflection and said scanning position of said spot.

24. The method according to claim 21, further comprising the step of photoelectrically detecting a reflection from said surface of said substrate based on the optical properties of said latent image and said first mark means respectively, wherein said positional relation is detected on the basis of a variation of said reflection and said scanning position of said spot.

25. The method according to claim 21, further comprising the step of photoelectrically detecting a regular reflection and a scattering from said surface of said substrate respectively, wherein said positional relation is detected on the basis of a variation of said regular reflection, said scattering and said scanning position of said spot.

26. The method according to claim 21, wherein said second mark means is projected onto said substrate by a projection optical system provided between said mask and said substrate.

27. The method according to claim 26, further including illuminating the surface of said substrate, wherein said exposure energy beam has a first wavelength effective in sensitizing said photosensitive layer and said illuminating beam has a second wavelength which does not sensitize said photosensitive layer.

28. The method according to claim 26, further including illuminating the surface of said substrate, wherein said exposure energy beam and said illuminating beam each have a wavelength effective in sensitizing said photosensitive layer, and the sensitizing wavelengths are filtered from said illuminating beam.

29. A method according to claim 21, wherein said latent image is formed near said first mark means of said substrate.

30. A method for detecting a diversion in the registration of a substrate and a mask in an apparatus for aligning said substrate with said mask, said substrate having a first alignment mark and said mask having a second alignment mark formed thereon to have a predetermined positional relation with said first alignment mark when said substrate and said mask are brought into registration with each other, said method comprising the steps of:

forming a photosensitive layer on said substrate so that said first alignment mark is covered with said photosensitive layer;

positioning said substrate and said mask at a determined positional relation with each other;

projecting an exposure energy beam effective in sensitizing said photosensitive layer onto said substrate to be exposed through said mask to form on said photosensitive layer a latent image of said alignment mark so that said photosensitive layer covering a portion corresponding to said first alignment mark is sensitized by said exposure energy beam;

supplying a radiation beam onto a surface of said substrate; and detecting the positional relation between said first alignment mark and said latent image on the basis of optical information from said surface.

31. The method according to claim 30, further comprising the step of correcting said registration on the basis of said detected positional relation.

32. The method according to claim 30, further comprising the step of photoelectrically detecting a regular reflection of said radiation beam from said surface of said substrate, wherein said positional relation is detected on the basis of a variation of said regular reflection.

33. The method according to claim 30, further comprising the step of imaging said surface of said substrate on an imaging plane, wherein said positional relation is detected on the basis of an image formed on said imaging plane.

34. A method for detecting a diversion in the registration of a substrate and a mask in an apparatus for aligning said substrate with said mask, said substrate having a first mark means and said mask having a second mark means formed thereon to have a predetermined positional relation with said first mark means when said substrate and said mask are brought into registration with each other, said method comprising the steps of:
   forming a photosensitive layer on said substrate so that said first mark means is covered with said photosensitive layer;
   projecting, after said registration, an exposure energy beam of a wavelength effective in sensitizing said photosensitive layer onto said substrate to be exposed through said mask to form on said photosensitive layer a latent image of said second mark means;
   supplying a radiation beam onto said photosensitive layer; and
   detecting the positional relation between said first mark means and said latent imager on the basis of optical information from said photosensitive layer irradiated by said radiation beam.

35. A method for detecting a diversion in the registration of a substrate and a mask in an apparatus for aligning said substrate with said mask, said substrate having a first mark means and said mask having a second mark means formed thereon to have a predetermined positional relation with said first mark means when said substrate and said mask are brought into registration with each other, said method comprising the steps of:
   forming a photosensitive layer on said substrate so that said first mark means is covered with said photosensitive layer;
   projecting, after said registration, an exposure energy beam onto said substrate to be exposed through said mask to form on said photosensitive layer a latent image of said second mark means;
   supplying a radiation beam incapable of sensitizing said photosensitive layer onto said photosensitive layer; and
   detecting the positional relation between said first mark means and said latent image on the basis of optical information from said first mark means irradiated by said radiation beam and from said latent image irradiated by said radiation beam.

36. A method for detecting a diversion in the registration of a substrate and a mask in an apparatus for aligning said substrate with said mask, said substrate having a first mark means and said mask having a second mark means formed thereon to have a predetermined positional relation with said first mark means when said substrate and said mask are brought into registration with each other, said method comprising the steps of:
   forming a photosensitive layer on said substrate so that said first mark means is covered with said photosensitive layer;
   projecting, after said registration, a first energy beam capable of sensitizing said photosensitive layer onto said substrate to be exposed through said mask to form on said photosensitive layer a latent image of said second mark means;
   supplying a second energy beam from an alignment optical system onto a surface of said substrate through said mask for illuminating said photosensitive layer, where said latent image is formed thereon, to form optical information;
   receiving said optical information be said alignment optical system; and
   detecting the positional relation between said first mark means and said latent image on the basis of said optical information.

37. The method according to claim 36, wherein said alignment optical system includes a light source adapted to generate said second energy beam and image pickup means adapted to receive said optical information.

38. The method according to claim 36, wherein said apparatus including a projection optical system provided between said mask and said substrate, and wherein said projection optical system supplies said first energy beam onto said surface of said substrate through said mask and projection optical system.

39. A method for detecting a diversion in the registration of a substrate and a mask in an apparatus for aligning said substrate with said mask, said substrate having a first mark and said mask having a second mark formed thereon to have a predetermined positional relation with said first mark when said substrate and said mask are brought into registration with each other, said method comprising the steps of:
   forming a photosensitive layer on said substrate so that said first mark is covered with said photosensitive layer;
   positioning said substrate and said mask at a determined positional relation with each other;
   projecting an exposure energy beam of a wavelength sensitizing said photosensitive layer onto said substrate to be exposed through said mask to form on said photosensitive layer a latent image of said second mark so that said photosensitive layer covering a portion corresponding to said first mark is sensitized by said exposure energy beam;
   supplying a radiation beam onto a surface of said substrate to form optical information; and
   detecting the positional relation between said first mark and said latent image on the basis of said optical information.

40. A method for detecting a diversion in the registration of a substrate and a mask in an apparatus for aligning said substrate with said mask, said substrate having a first mark means and said mask having a second mark means provided with a light transparent window and formed thereon to have a predetermined positional relation with said first mark means when said substrate and said mask are brought into registration with each other, said method comprising the steps of:
   forming a photosensitive layer on said substrate so that said first mark means is covered with said photosensitive layer;
   projecting, after said registration, an energy beam onto said substrate to be exposed through said mask to form on said photosensitive layer a latent image of said second mark means;
   supplying a radiation beam onto a surface of said substrate; and
   detecting the positional relation between said first mark means and said latent image on the basis of optical information generated from said surface.

41. The method according to claim 40, wherein said apparatus includes a projection optical system provided between said mask and substrate and an alignment optical system, and said projection optical system is adapted to supply said energy beam on said surface of said substrate through said light transparent window and projection optical system.

42. A semiconductor device manufacturing method for use with an original having a first mask and a substrate having a second mark and a layer of photosensitive material thereon, said method comprising the steps of:
- transferring an image of the first mark of the original onto the photosensitive material layer of the substrate by using an exposure beam, wherein the transferred image of the first mark is distinguishable from a portion of the photosensitive material around the transferred image without development of the photosensitive material;
- detecting the second mark of the substrate and the image of the first mark, being transferred onto the photosensitive layer, but being non-developed, to produce data; and
- using the produced data for manufacturing a semiconductor device.

43. A method according to claim 42, further comprising projecting the first mark on the photosensitive material layer of the substrate through a projection optical system to form the image of the first mark thereon.

44. A method according to claim 43, further comprising effecting the detection of the second mark of the substrate and the transferred but non-developed image of the first mark of the original without intervention of the projection optical system.

45. A method according to claim 42, wherein the portion of the photosensitive material layer in which the transferred image of the first mark of the original is formed differs in optical property from the portion of the photosensitive material around the transferred image.

* * * * *

UNITED STATES PATENT AND TRADEMARK OFFICE
CERTIFICATE OF CORRECTION

PATENT NO. : 5,262,822

DATED : November 16, 1993

INVENTOR(S) : MASAO KOSUGI, ET AL.

It is certified that error appears in the above-indentified patent and that said Letters Patent is hereby corrected as shown below:

On the title page:

In item [75] "Inventors":

"Kanagawa" should read --Yokohama--.

In item [60] "Related U.S. Application Data":

Line 1, "Division of Ser. No. 874,205" should read --Continuation of Ser. No. 874,205--.

In item [56] under "U.S. PATENT DOCUMENTS":

"4,402,586  9/1986" should read --4,402,596  9/1983--.

In item [57] "ABSTRACT":

Line 3, "is disclosed." should be deleted;
Line 5, "wafer," should read --wafer is disclosed,--; and
Lines 11-13, "wafer, the latent image of the alignment mark of the mask formed on the resist layer of the wafer." should read --wafer.--.

UNITED STATES PATENT AND TRADEMARK OFFICE
CERTIFICATE OF CORRECTION

PATENT NO. : 5,262,822                    Page 2 of 3
DATED      : November 16, 1993
INVENTOR(S): MASAO KOSUGI, ET AL.

It is certified that error appears in the above-indentified patent and that said Letters Patent is hereby corrected as shown below:

COLUMN 10:

Line 54, "selectively" should read --selective--; and
Line 59, "wafer said" should read --wafer, said--.

COLUMN 12:

Line 35, "step" should read --steps--; and
Line 64, "to exposed" should read --to be exposed--.

COLUMN 15:

Line 23, "imager" should read --image--.

UNITED STATES PATENT AND TRADEMARK OFFICE
CERTIFICATE OF CORRECTION

PATENT NO. : 5,262,822                    Page  3  of  3
DATED      : November 16, 1993
INVENTOR(S): MASAO KOSUGI, ET AL.

It is certified that error appears in the above-indentified patent and that said Letters Patent is hereby corrected as shown below:

COLUMN 16:

Line 3, "be" should read --by--; and
    Line 13, "including" should read --includes--.

Signed and Sealed this

Fifteenth Day of November, 1994

Attest:

BRUCE LEHMAN

Attesting Officer        Commissioner of Patents and Trademarks